United States Patent
Maejima et al.

(10) Patent No.: US 7,249,368 B2
(45) Date of Patent: Jul. 24, 2007

(54) TUNER APPARATUS

(75) Inventors: Kazuhiko Maejima, Kanagawa (JP); Toshiyuki Yamauchi, Kanagawa (JP); Koichi Ohya, Kanagawa (JP)

(73) Assignee: Sony Corporation (JP)

( * ) Notice: Subject to any disclaimer, the term of this patent is extended or adjusted under 35 U.S.C. 154(b) by 1066 days.

(21) Appl. No.: 09/855,786

(22) Filed: May 15, 2001

(65) Prior Publication Data
US 2001/0045994 A1 Nov. 29, 2001

(30) Foreign Application Priority Data
May 17, 2000 (JP) ............................ P2000-144946

(51) Int. Cl.
*H04N 7/20* (2006.01)
(52) U.S. Cl. ........................................ 725/68; 348/726
(58) Field of Classification Search .................. 725/63, 725/68, 73, 131, 139, 151, 48; 348/554, 348/731, 558, 555, 726; 455/180.2, 188.2
See application file for complete search history.

(56) References Cited

U.S. PATENT DOCUMENTS

| | | | | |
|---|---|---|---|---|
| 4,933,860 A | * | 6/1990 | Liu | 716/19 |
| 5,010,400 A | | 4/1991 | Oto | 358/86 |
| 5,014,349 A | * | 5/1991 | Kubo et al. | 455/189.1 |
| 5,382,971 A | * | 1/1995 | Chanteau | 725/144 |
| 5,666,170 A | * | 9/1997 | Stewart | 348/726 |
| 5,774,194 A | * | 6/1998 | Armbruster | 348/726 |
| 6,094,236 A | * | 7/2000 | Abe et al. | 348/731 |
| 6,634,027 B1 | * | 10/2003 | Johnson | 725/67 |

FOREIGN PATENT DOCUMENTS

| | | |
|---|---|---|
| DE | 3226980 | 1/1984 |
| EP | 276144 A2 | 7/1988 |
| EP | 401932 A1 | 12/1990 |
| GB | 2325804 | 12/1998 |
| JP | 408066 A2 | 1/1991 |

* cited by examiner

*Primary Examiner*—Christopher Grant
*Assistant Examiner*—Gary Au
(74) *Attorney, Agent, or Firm*—Lerner, David, Littenberg, Krumholz & Mentlik, LLP

(57) ABSTRACT

The present invention provides a tuner apparatus operating as a common tuner capable of receiving both satellite digital TV and terrestrial TV broadcasting. A tuner configured, according to the invention operates as follows. As the tuner apparatus receives satellite TV broadcasting, intermediate-frequency signals SIF1 are supplied to its quadrature detector circuit where the SIF1 signals are demodulated into baseband signals SI and SQ by using oscillation signals supplied thereto from its oscillator. As the tuner apparatus receives terrestrial TV or CATV broadcasting, terrestrial TV or CATV broadcast wave signals are supplied to its mixer circuit where these signals are frequency-converted into intermediate-frequency signals SIF1 that fall within the bandwidth of the satellite TV broadcasting SIF1 signals. The first intermediate-frequency signals SIF1 are supplied to the quadrature detector circuit where the SIF1 signals are frequency-converted into second SIF2 signals by using oscillation signals supplied thereto from the oscillator.

8 Claims, 2 Drawing Sheets

TUNER APPARATUS

BACKGROUND OF THE INVENTION

1. Field of the Invention

The present invention relates a tuner apparatus for receiving TV broadcasting.

2. Description of Related Invention

A typical currently used tuner unit is configured, for example, as shown in FIG. 1. Terrestrial TV broadcasting waves are received by an antenna 11 and the received broadcast wave signals SRX pass through an input bandpass filter 12, a radio frequency amplifier 13, and a bandpass filter 14, which form a signal line, and are supplied to a mixer circuit 15.

To the mixer circuit 15, oscillation signals in a predetermined frequency band are supplied from an oscillator circuit 16. In the mixer, by using the oscillation signals, the target channel broadcast wave signals out of the broadcast wave signals SRX are frequency-converted into intermediate-frequency signals SIF. These SIF signals, after passing through an intermediate-frequency amplifier 17, are outputted at a terminal 18 and subjected to further processing.

The same tuner configuration and operation are also true for CATV broadcasting, except that broadcast waves are inputted by means of a coaxial cable instead of the antenna On the other hand, a tuner unit for satellite digital TV broadcasting is configured, for example, as shown in FIG. 2. This tuner is a double-superheterodyne type. Broadcast waves from a satellite are received by a parabolic antenna unit 21 and frequency-converted into first intermediate-frequency signals SIF1 in a predetermined intermediate frequency band. The SIF1 signals pass through a first intermediate-frequency filter 22, a first intermediate-frequency amplifier 23, and a first intermediate-frequency filter 24, which form a signal line, and are supplied to a mixer circuit 25.

To the mixer circuit 25, oscillation signals in a predetermined frequency band are supplied from an oscillator circuit 26. In the mixer, by using the oscillation signals, the first intermediate-frequency signals as target channel broadcast wave signals out of the SIF1 signals are frequency-converted into second intermediate-frequency signals SIF2. The SIF2 signals, after passing through a second intermediate-frequency filter 27 and a second intermediate-frequency amplifier 28, are supplied to a quadrature detector circuit 31.

To the detector circuit 31, oscillation signals for quadrature detection in a frequency band identical to the second intermediate-frequency band, but with the phase being shifted 90 degrees from the phase of the second intermediate-frequency signals, are supplied from an oscillator circuit 32. In the detector circuit 31, by using the oscillation signals, the second intermediate-frequency signals are demodulated into baseband signals SI and SQ that correspond to their in-phase component and quadrature component (real axis component and imaginary axis component). These SI and SQ signals are outputted at terminals 33I and 33Q and subjected to further processing.

Another type of tuner unit for satellite digital TV broadcasting is, for example, as shown in FIG. 3. Broadcast waves from a satellite are received by a parabolic antenna unit 21 and frequency-converted into first intermediate-frequency signals SIF1 in a predetermined intermediate-frequency band. The first SIF1 signals pass through a first intermediate-frequency filter 22, a first intermediate-frequency amplifier 23, and a first intermediate-frequency filter 24, which form a signal line, and are supplied to a quadrature detector circuit 31.

To the detector circuit 31, oscillation signals for quadrature detection in a frequency band identical to the frequency band of the first intermediate-frequency signals as target channel signals out of the SIF1 signals, but with the phase being shifted 90 degrees from the phase of the first intermediate-frequency signals are supplied from an oscillator circuit 32. In the detector circuit, by using the oscillation signals, the SIF1 signals are demodulated into baseband signals SI and SQ which correspond to their in-phase component and quadrature component (real axis component and imaginary axis component). These SI and SQ signals are outputted at terminals 33I and 33Q and subjected to further processing.

The broadcast wave-receiving tuner shown in FIG. 3 is called a direct conversion type or alternatively a zero IF circuit type because the second intermediate frequency is 0. The circuit configuration of this tune unit is simpler than that of the double-superheterodyne tuner shown in FIG. 2.

Meanwhile, recently, an increasing number of people wish to have a single receiver capable of receiving terrestrial TV broadcasting, CATV broadcasting, and satellite digital TV broadcasting.

If a single receiver is configured so as to be capable of receiving these three types of TV broadcasting, the tuner unit shown in FIG. 1 and the tuner unit shown in FIG. 2 or FIG. 3 must be integrated into the single receiver. This, however, poses some problem such as increase of the cost of producing the receiver and enlargement of the receiver.

SUMMARY OF THE INVENTION

The present invention is intended to be solution to such problem.

The present invention is embodied as, for example, a tuner apparatus comprising:

a satellite TV broadcasting receiver for receiving satellite TV broadcast wave signals and outputting satellite TV broadcasting intermediate-frequency signals;

a terrestrial TV broadcasting or CATV broadcasting receiver for receiving terrestrial TV broadcast or CATV broadcast wave signals.

a mixer circuit for frequency-converting the terrestrial TV broadcast or CATV broadcast wave signals into those to fall within the bandwidth of the satellite TV broadcasting intermediate-frequency signals by using first oscillation signals in a predetermined frequency band and outputting first intermediate-frequency signals.

a quadrature detector circuit to which the satellite TV broadcasting intermediate-frequency signals and the first intermediate-frequency signals are inputted;

a first oscillator circuit for supplying the first oscillation signals to the mixer circuit; and a second oscillator circuit for supplying second oscillation signals to the quadrature detector circuit;

wherein when the tuner receives satellite TV broadcasting, the second oscillator circuit oscillates the second oscillation signals in a predetermined frequency band and of a predetermined phase and the satellite TV broadcasting intermediate-frequency signals supplied to the quadrature detector circuit are demodulated into baseband signals by using the second oscillation signals; and wherein when the tuner receives terrestrial TV broadcasting or CATV broadcasting, the second oscillator circuit oscillates the second oscillation signals in a predetermined frequency band and the first intermediate-frequency signals supplied to the quadrature detector circuit are frequency-converted into second intermediate-frequency signals by using the second oscillation signals.

Thus, the major circuits of the tuner are used as common components for receiving both satellite TV broadcasting and terrestrial TV broadcasting.

DETAILED DESCRIPTION OF THE PREFERRED EMBODIMENTS

Figure 1:
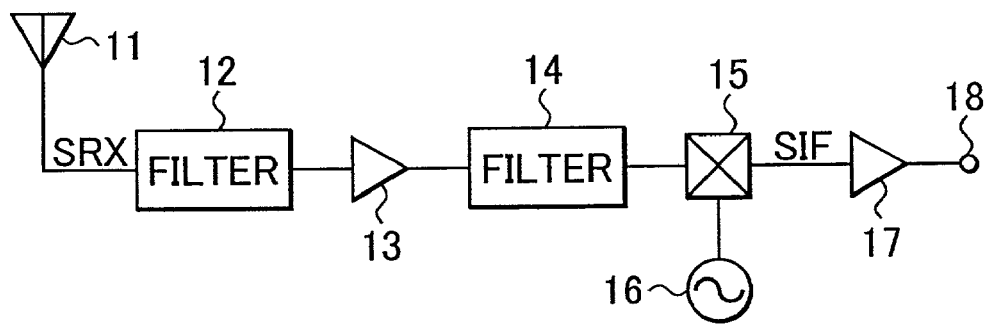
FIG. 1 is a schematic diagram of typical tuner apparatus intended for explaining the present invention.
Figure 2:
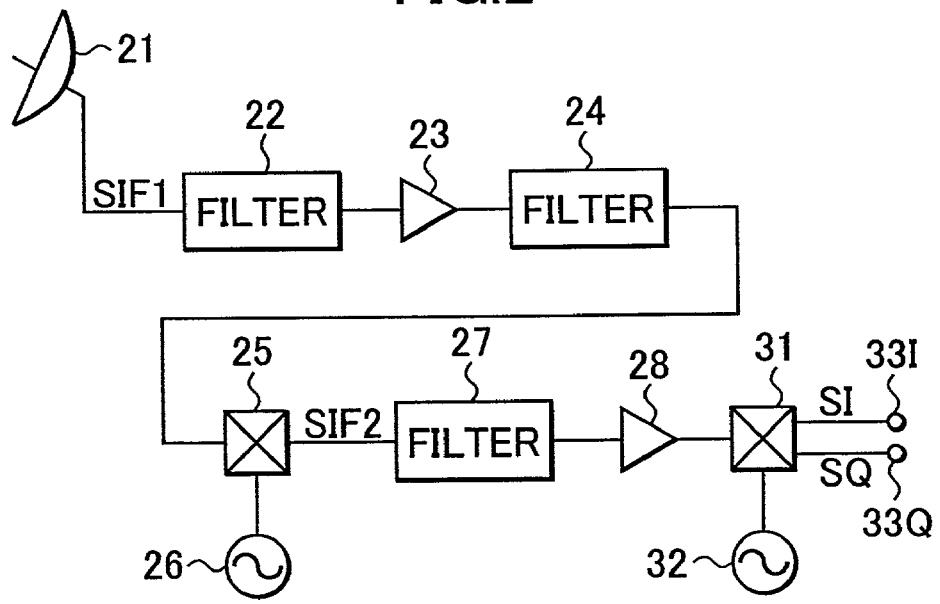
FIG. 2 is a schematic diagram of typical tuner apparatus intended for explaining the present invention.
Figure 3:
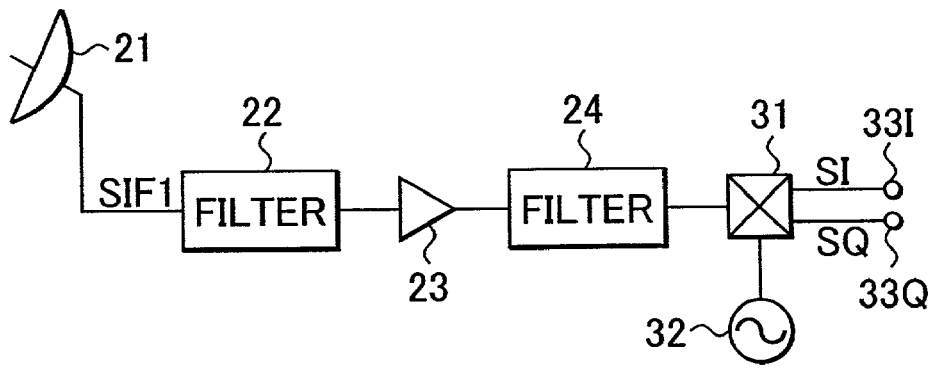
FIG. 3 is a schematic diagram of typical tuner apparatus intended for explaining the present invention.
Figure 4:
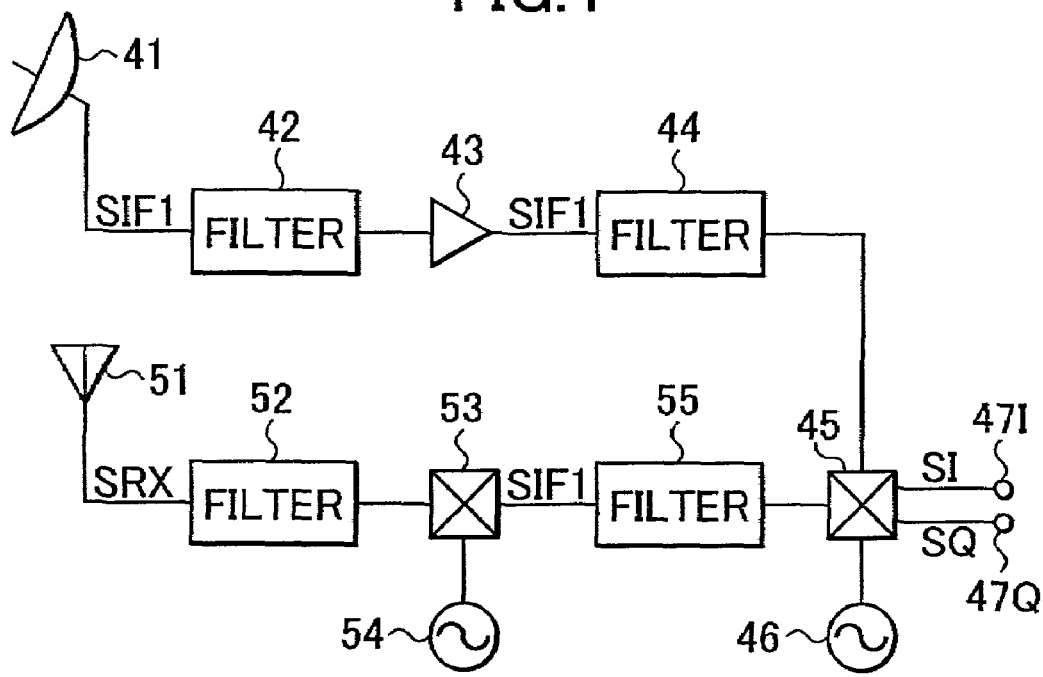
FIG. 4 is a schematic diagram showing tuner apparatus of a preferred embodiment of the present invention.

As a preferred embodiment of the invention, a tuner apparatus shown in FIG. 4 comprises a tuner portion for satellite digital TV broadcasting that is configured as the direct conversion type tuner and a tuner portion for terrestrial TV broadcasting that is configured as the double-superheterodyne type tuner.

As the tuner receives satellite digital TV broadcasting, broadcast waves from a satellite are received by a parabolic antenna 41 and frequency-converted into first intermediate-frequency signals SIF1 in a predetermined intermediate-frequency band (for example, an occupied bandwidth of 950 to 2150 MHz (in Japan)). The SIF1 signals pass through a first intermediate-frequency filter 42, a first intermediate-frequency amplifier 43, and a first intermediate-frequency filter 44, which form a signal line, and are supplied to a quadrature detector circuit 45.

An oscillator circuit 46 generates oscillation signals in a frequency band identical to the frequency band of the first intermediate-frequency signals as target channel signals out of the SIF1 signals, but with the phase being shifted 90 degrees from the phase of the first intermediate-frequency signals. These oscillation signals are supplied to the detector circuit 45 where, by using the oscillation signals, the SIF1 signals are demodulated into baseband signals SI and SQ that correspond to the in-phase component and quadrature component (real axis component and imaginary axis component) of the target channel signals. These SI and SQ signals are outputted at terminals 47I and 47Q and subjected to further processing.

A next-stage circuit (not shown) executes predetermined signal processing for the SI and SQ signals outputted at the terminals 47I and 47Q and these signals are demodulated into video and audio signals.

On the other hand, as the tuner receives terrestrial TV broadcasting, terrestrial TV broadcast waves are received by an antenna 51 and the received broadcast wave signals SRX pass through an input bandpass filter 52 and are supplied to a first mixer circuit 53.

A first oscillator circuit 54 generates first oscillation signals in a predetermined frequency band. These first oscillation signals are supplied to the mixer circuit 53 where, by using the oscillation signals, the target channel broadcast wave signals out of the broadcast wave signals SRX are frequency-converted into first intermediate-frequency signals SIF1. In this case, however, the first oscillator circuit 54 selects a first oscillation frequency band so that the SIF1 signals will fall within the occupied bandwidth of the satellite digital TV broadcasting SIF1 signals. For example, the occupied bandwidth of the terrestrial TV broadcasting SIF1 signals is set at a range of 950 to 1625 MHz (in Japan).

The terrestrial TV broadcasting SIF1 signals pass through a first intermediate-frequency filter 55 and are supplied to the quadrature detector circuit 45. As the tuner receives terrestrial TV broadcasting, this quadrature detector circuit 45 operates as a second mixer circuit. Thus, the oscillator circuit 46 generates second oscillation signals in a frequency band corresponding to the first intermediate-frequency signals as the target channel signals. These second oscillation signals are supplied to the quadrature detector circuit (second mixer circuit) 45 where, by using the oscillation signals, the SIF1 signals are frequency-converted into second intermediate-frequency signals SIF2 (which are other than 0). The SIF2 signals are outputted at the terminal 47I or 47Q and subjected to further processing.

A next-stage circuit (not shown) executes predetermined signal processing for the SIF2 signals outputted at the terminal 47I or 47Q and these signals are demodulated into video and audio signals.

As the tuner receives CATV broadcasting, broadcast wave signals of the CATV broadcasting are supplied to the tuner by means of a coaxial cable connected thereto instead of the antenna 51. The tuner apparatus receives the broadcast wave signals in the same way as it receives terrestrial TV broadcasting.

Thus, this tuner apparatus is able to receive satellite digital TV broadcasting and terrestrial TV broadcasting (and CATV broadcasting). It is worth mentioning that the most part of this tuner apparatus can operate as common components of both the tuner unit for receiving satellite digital TV broadcasting and the tuner unit for receiving terrestrial TV broadcasting. Therefore, the cost of producing this tuner apparatus can be as much as that of a typical known tuner without enlarging the tuner apparatus size.

Figure 5:
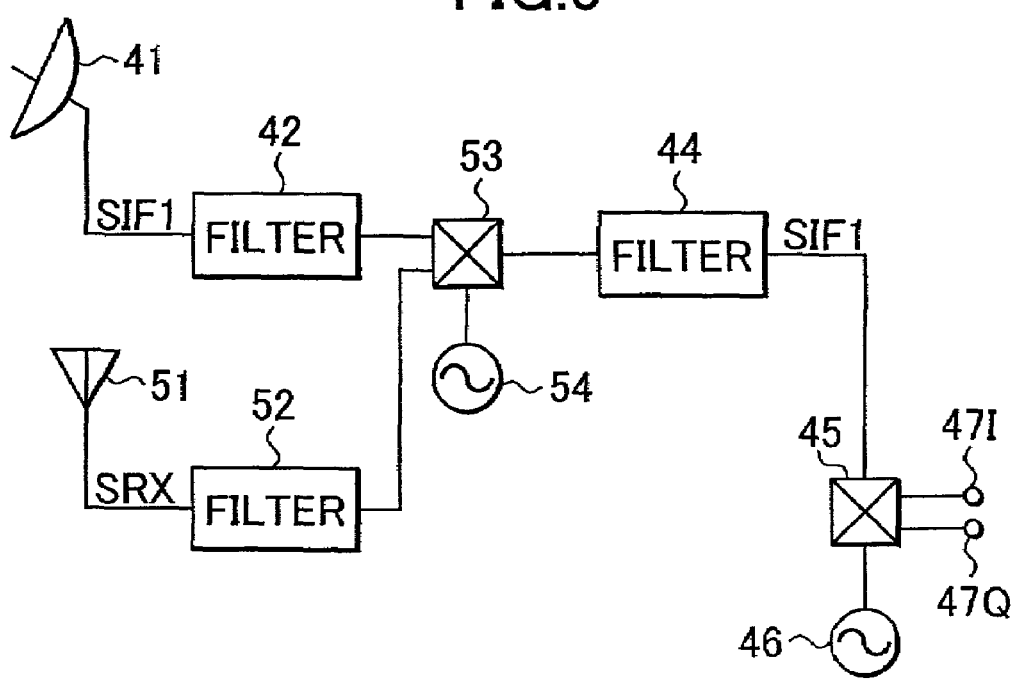
FIG. 5 is a schematic diagram showing tuner apparatus of a preferred embodiment of the present invention.

As another preferred embodiment of the invention, a simpler tuner apparatus configuration is shown in FIG. 5. As the tuner receives satellite digital TV broadcasting, broadcast waves from a satellite are received by a parabolic antenna 41 and frequency-converted into first intermediate-frequency signals SIF1 in a predetermined intermediate-frequency band. The SIF1 signals pass through a first intermediate-frequency filter 42 and are supplied to a first mixer circuit 53. As the tuner receives satellite digital TV broadcasting, however, the first mixer circuit 53 is not supplied with oscillation signals and consequently simply operates as a first intermediate-frequency amplifier.

The SIF1 signals from this first mixer circuit (first intermediate-frequency amplifier) 53 pass through a first intermediate-frequency filter 44 and are supplied to a quadrature detector circuit 45.

An oscillator circuit 46 generates oscillation signals in a frequency band identical to the frequency band of the first intermediate-frequency signals as target channel signals out of the SIF1 signals, but with the phase being shifted 90 degrees from the phase of the first intermediate-frequency signals. These oscillation signals are supplied to the detector circuit 45 where, by using the oscillation signals, the SIF1 signals are demodulated into baseband signals SI and SQ that correspond to the in-phase component and quadrature component (real axis component and imaginary axis component) of the target channel signals. These SI and SQ signals are outputted at terminals 47I and 47Q and subjected to further processing.

A next-stage circuit (not shown) executes predetermined signal processing for the SI and SQ signals outputted at the terminals 47I and 47Q and these signals are demodulated into video and audio signals.

On the other hand, as the tuner receives terrestrial TV broadcasting, terrestrial TV broadcast waves are received by an antenna 51 and the received broadcast wave signals SRX pass through an input bandpass filter 52 and are supplied to the first mixer circuit 53.

A first oscillator circuit 54 generates first oscillation signals in a predetermined frequency band. These first oscillation signals are supplied to the mixer circuit 53 where, by using the oscillation signals, the target channel broadcast wave signals out of the broadcast wave signals SRX are frequency-converted into first intermediate-frequency signals SIF1. In this case, however, the first oscillator circuit 54 selects a first oscillation frequency band so that the SIF1 signals will fall within the occupied bandwidth of the satellite digital TV broadcasting SIF1 signals.

Then, the terrestrial TV broadcasting SIF1 signals pass through a first intermediate-frequency filter 44 and are supplied to the quadrature detector circuit 45. As the tuner receives terrestrial TV broadcasting, this quadrature detector circuit 45 operates as a second mixer circuit. Thus, the oscillator circuit 46 generates second oscillation signals in a frequency band corresponding to the first intermediate-frequency signals as the target channel signals. These second oscillation signals are supplied to the quadrature detector circuit (second mixer circuit) 45 where, by using the oscillation signals, the SIF1 signals are frequency-converted into second intermediate-frequency signals SIF2 (which are other than 0). The SIF2 signals are outputted at the terminal 47I or 47Q and subjected to further processing.

A next-stage circuit (not shown) executes predetermined signal processing for the SIF2 signals outputted at the terminal 47I or 47Q and these signals are demodulated into video and audio signals.

As the tuner receives CATV broadcasting, broadcast wave signals of the CATV broadcasting are supplied to the tuner by means of a coaxial cable connected thereto instead of the antenna 51. The tuner apparatus receives the broadcast wave signals in the same way as it receives terrestrial TV broadcasting.

Thus, this tuner apparatus is able to receive satellite digital TV broadcasting and terrestrial TV broadcasting (and CATV broadcasting). The following is worth mentioning. With the exception of the filters 42 and 52, the circuits of this tuner apparatus can operate as common components for receiving both satellite digital TV broadcasting and terrestrial TV broadcasting, and consequently the configuration of the tuner apparatus can be made simpler.

What is claimed is:

1. A tuner apparatus comprising:
   a mixer circuit for using first oscillation signals to upwardly frequency-convert terrestrial TV broadcast signals or CATV broadcast signals supplied from a terrestrial TV broadcasting receiver or a CATV broadcasting receiver into signals that fall within an occupied bandwidth of intermediate-frequency signals of satellite TV broadcasting signals supplied from a satellite TV broadcasting receiver, said mixer circuit outputting first intermediate-frequency signals;
   a quadrature detector circuit to which said intermediate-frequency signals of said satellite TV broadcasting signals and said first intermediate-frequency signals from said mixer circuit are inputted; and
   an oscillator circuit for supplying second oscillation signals of the occupied bandwidth of said intermediate-frequency signals of said satellite TV broadcasting signals to said quadrature detector circuit,
   wherein when said tuner apparatus receives satellite TV broadcasting signals, said oscillator circuit supplies said second oscillation signals of the occupied bandwidth and of a predetermined phase to said quadrature detector circuit where said satellite TV broadcasting intermediate-frequency signals supplied thereto are demodulated into baseband signals by using said second oscillation signals, and
   wherein when the tuner receives said terrestrial TV broadcast signals or said CATV broadcast signals, said oscillator circuit supplies said second oscillation signals to said quadrature detector circuit where said first intermediate-frequency signals supplied thereto are demodulated into baseband signals by using said second oscillation signals,
   wherein said mixer frequency-converts only said TV broadcast signals or said CATV broadcast signals and does not frequency-convert said satellite TV broadcasting signals.

2. The tuner apparatus according to claim 1, further comprising an intermediate-frequency amplifier disposed between said satellite TV broadcasting receiver and said quadrature detector circuit.

3. The tuner apparatus according to claim 2, wherein when the tuner receives said satellite TV broadcasting signals, said intermediate-frequency signals obtained by receiving the satellite TV broadcasting signals are supplied through said mixer circuit to said quadrature detector circuit and said mixer circuit operates as said intermediate-frequency amplifier.

4. A tuner apparatus comprising:
   a satellite TV broadcasting receiver for receiving satellite TV broadcast signals and outputting satellite TV broadcasting intermediate-frequency signals;
   a terrestrial TV broadcasting receiver or CATV broadcasting receiver for receiving terrestrial TV broadcast or CATV broadcast signals;
   a mixer circuit for using first oscillation signals to upwardly frequency-convert said terrestrial TV broadcast signals or said CATV broadcast signals into signals within the bandwidth of said satellite TV broadcasting intermediate-frequency signals, said mixer outputting first intermediate-frequency signals;
   a quadrature detector circuit to which said intermediate-frequency signals of said satellite TV broadcasting signals and said first intermediate-frequency signals from said mixer are inputted;
   a first oscillator circuit for supplying said first oscillation signals to said mixer circuit; and
   a second oscillator circuit for supplying second oscillation signals of the occupied bandwidth of said intermediate-frequency signals of said satellite TV broadcasting signals to said quadrature detector circuit,
   wherein when said tuner apparatus receives said satellite TV broadcasting signals, said second oscillator circuit supplies said second oscillation signals of the occupied bandwidth and of a predetermined phase to said quadrature detector circuit where said satellite TV broadcasting intermediate-frequency signals supplied thereto are demodulated into baseband signals by using said second oscillation signals; and wherein when the tuner apparatus receives terrestrial TV broadcast signals or said CATV broadcast signals, said second oscillator circuit supplies said second oscillation signals to said quadrature detector circuit where said first intermediate-frequency signals supplied thereto are demodulated into baseband signals by using said second oscillation signals, wherein said mixer frequency-converts only said TV broadcast signals or said CATV broadcast signals and does not frequency-convert said satellite TV broadcasting signals.

5. The tuner apparatus according to claim 4, further comprising an intermediate-frequency amplifier disposed between said satellite TV broadcasting receiver and said quadrature detector circuit.

6. The tuner apparatus according to claim 4, further comprising an intermediate-frequency filter disposed between said satellite TV broadcasting receiver and said quadrature detector circuit or between said mixer circuit and said quadrature detector circuit.

7. The tuner apparatus according to claim 4, further comprising an input bandpass filter disposed after said satellite TV broadcasting receiver or after said CATV broadcasting receiver.

8. The tuner apparatus according to claim 4, wherein when said tuner apparatus receives said satellite TV broadcasting signals, said intermediate-frequency signals obtained by receiving said satellite TV broadcasting are supplied through said mixer circuit to said quadrature detector circuit and said mixer circuit operates as said intermediate-frequency amplifier.

* * * * *